US008315679B2

(12) United States Patent
Husband et al.

(10) Patent No.: US 8,315,679 B2
(45) Date of Patent: Nov. 20, 2012

(54) SUPERCONDUCTING DEVICE

(75) Inventors: Stephen M. Husband, Derby (GB); Philip M. Sargent, Cambridge (GB); Archie M. Campbell, Cambridge (GB); Tim A. Coombs, Cambridge (GB)

(73) Assignee: Rolls-Royce PLC, London (GB)

( * ) Notice: Subject to any disclaimer, the term of this patent is extended or adjusted under 35 U.S.C. 154(b) by 327 days.

(21) Appl. No.: 12/920,160

(22) PCT Filed: Mar. 11, 2009

(86) PCT No.: PCT/GB2009/000649
§ 371 (c)(1), (2), (4) Date: Aug. 30, 2010

(87) PCT Pub. No.: WO2009/122126
PCT Pub. Date: Oct. 8, 2009

(65) Prior Publication Data

US 2011/0003696 A1 Jan. 6, 2011

(30) Foreign Application Priority Data

Apr. 3, 2008 (GB) .................................. 0805988.3

(51) Int. Cl.
*H01L 39/24* (2006.01)

(52) U.S. Cl. ....................................................... 505/230

(58) Field of Classification Search .................. 505/163, 505/230
See application file for complete search history.

(56) References Cited

U.S. PATENT DOCUMENTS

| | | | |
|---|---|---|---|
| 5,140,290 A | 8/1992 | Dersch | |
| 5,546,261 A | 8/1996 | Yoshida et al. | |
| 5,711,157 A * | 1/1998 | Ohtani et al. | 62/6 |
| 2005/0062473 A1 * | 3/2005 | Ryan et al. | 324/318 |

FOREIGN PATENT DOCUMENTS

| | | |
|---|---|---|
| JP | A-01-144602 | 6/1989 |
| WO | WO 2006/061578 A1 | 6/2006 |

OTHER PUBLICATIONS

Haid et al., "Design analysis of a solid nitrogen cooled "permanent" hightemperature superconducting magnet system," *Cryogenics*, vol. 42, No. 10, Oct. 1, 2002, pp. 617-634.

Iwasa Yukikazu, "HTS and NMR/MRU magnets: Unique features, opportunities, and challenges," *Physica C*, vol. 445-448, Oct. 1, 2006, pp. 1088-1094.

International Search Report issued in Application No. PCT/GB2009/000649; Dated Jun. 8, 2009.

Written Opinion of the International Searching Authority issued in Application No. PCT/GB2009/000649; Dated Jun. 8, 2009.

British Search Report issued in Application No. 0805988.3; Dated Jun. 23, 2008.

* cited by examiner

*Primary Examiner* — Colleen Dunn

(74) *Attorney, Agent, or Firm* — Oliff & Berridge, PLC

(57) ABSTRACT

A superconducting device comprises a vacuum chamber and means to evacuate the vacuum chamber. A base plate is provided within the vacuum chamber and first, second and third cylindrical walls extend from the base plate. The second and third cylindrical walls are arranged coaxial with the first cylindrical wall. A first chamber is defined between the first cylindrical wall and the second cylindrical wall, a second chamber is defined between the second cylindrical wall and the third cylindrical wall and a third chamber is defined within the third cylindrical wall. A superconducting wire is arranged within the second chamber and a cryogenic insulating material is arranged within the second chamber to encapsulate the superconducting wire. A material having a high specific heat capacity is arranged within the first chamber and there are means to cool the base plate.

20 Claims, 2 Drawing Sheets

SUPERCONDUCTING DEVICE

The present invention relates to a superconducting device, for example a superconducting fault current limiter.

Certain materials e.g. metal, alloys or compounds exhibit a phenomenon known as "superconductivity". These materials, known as superconductors, can if cooled below a certain critical temperature, lose all their electrical resistivity and are able to carry large electrical currents without a voltage drop or Joule heating. To maintain a superconductor in a superconducting state, the material has to be cooled to a cryogenic temperature, the precise temperature required depends largely upon the type of superconducting material.

There are three types of superconductors, e.g. low temperature superconductors, magnesium diboride an intermediate temperature superconductor and high temperature superconductors. Low temperature superconductors (LTS) have critical temperatures typically below 15K. High temperature superconductors (HTS) have critical temperatures as high as 110K. Magnesium diboride has a critical temperature of 39K intermediate the low temperature superconductors and the high temperature superconductors.

Low temperature superconductors are generally cooled to temperatures around 4K using liquid helium, often with a cryogenic refrigerator, a cryocooler, to re-condense the helium as it boils away due to parasitic heat loads. In some cases, the cooling may be achieved without liquid helium, by linking the low temperature superconductor to the cryocooler directly using a thermal conductor. However, such a system is vulnerable to a failure of, or a loss of power to, the cryocooler, because the low heat capacity of metals at cryogenic temperatures gives very limited endurance if the cooling of the superconductor is interrupted.

Although the requirements for the cryocooler for a high temperature superconductor are less onerous than for a low temperature superconductor, in practice the cost of the material for the high temperature superconductor is prohibitively high and as a result high temperature superconductors have very limited commercial uses.

It is expected that magnesium diboride will be inexpensive to manufacture and process and it is expected that it will be possible to produce magnesium diboride superconducting devices operating between temperatures of 20K and 30K and this would provide a significant cryogenic advantage over the low temperature superconductors.

However, the problem with operating over the temperature range 20K to 30K is that there are no suitable cryogenic coolants. The only cryogenic coolants that have a liquid phase in this temperature range are hydrogen and neon, hydrogen has a boiling point of 20.4K and neon has a boiling point of 27.1K. Hydrogen is not suitable in many applications because of the risk of explosion. Neon is extremely expensive and is not readily available.

A recent suggestion has been to provide a cooling system using frozen nitrogen, solid nitrogen, instead of liquid hydrogen or liquid neon, and a cryocooler to freeze the nitrogen to any required temperature. The advantages of using nitrogen ara its specific heat capacity and the ability to pre-cool the system by pouring the liquid nitrogen into the system at a temperature of 77k and this reduces the time to reach the operating temperature. In addition liquid nitrogen is the cheapest and most easily obtained cryogenic liquid.

Unfortunately frozen, solid, nitrogen is unsuitable for real high voltage applications. Any voids, due to crazing, or cracking, within the frozen, solid, nitrogen due to thermal contraction will lead to internal voltage discharges, when operated at high voltages. Any situations where there is boiling off of the nitrogen will also lead to uncontrolled internal voltage discharges, when operated at high voltages. The requirement to handle the boiled off nitrogen gas when the superconductor device is turned off and the requirement to refill the device every time the nitrogen gas has boiled off and the requirement to maintain spare liquid nitrogen is considered impractical. All cryogenic liquids and their boiled off vapours are extremely cold and they may cause thermal burns. During boil off cryogenic liquids exhibit large volume exchange ratios that may lead to large pressure changes. For operation in an enclosed space this would be critical. In addition all cryogens can condense sufficient moisture in the air to block any pressure relief valves potentially leading to an explosion. All cryogenic liquids have the ability to condense oxygen leading to a significant potential for creating an oxygen deficient environment.

Accordingly the present invention seeks to provide a novel superconducting device which reduces, preferably overcomes, the above mentioned problem.

Accordingly the present invention provides a superconducting device comprising a vacuum chamber, means to evacuate the vacuum chamber, a first chamber and a second chamber arranged within the vacuum chamber, the first chamber and the second chamber have a common wall, a superconducting wire arranged within the second chamber, a cryogenic insulating material arranged within the second chamber to encapsulate the superconducting wire and a material having a high specific heat capacity arranged within the first chamber and means to cool the first and second chambers.

Preferably a third chamber is arranged within the vacuum chamber, the third chamber sharing a common wall with the second chamber or the first chamber.

Preferably the second chamber is arranged within the first chamber, the third chamber is arranged within the second chamber.

Alternatively the first chamber is arranged within the second chamber and the third chamber is arranged within the first chamber.

Preferably the superconducting wire is arranged as at least one coil in the second chamber.

Preferably the superconducting wire is arranged on a tubular former.

Preferably the superconducting wire is circular in cross-section.

Preferably the superconducting wire comprises magnesium diboride.

Preferably the material having a high specific heat capacity comprises an oil, a grease, water or a wax. The oil may be an electrical oil, for example Midel Oil®, the grease may be a vacuum grease, for example Apiezon N cryogenic high vacuum grease, the wax may be beeswax or paraffin wax.

A conducting mesh may be provided in the material having a high specific heat capacity. The conducting mesh may comprise copper.

Preferably the cryogenic insulating material comprises a cryogenic insulating resin.

Preferably the superconducting wire forms a superconducting fault current limiter.

Preferably the third chamber is evacuated.

Preferably a fourth chamber is arranged within the vacuum chamber, the third chamber sharing a common wall with the second chamber, the fourth chamber sharing a common wall with the third chamber, a material having a high specific heat capacity arranged within the third chamber.

Preferably the fourth chamber is evacuated.

Preferably the first chamber is an annular chamber and the second chamber is an annular chamber.

Preferably the first chamber is defined between a first wall and a second, the second chamber is defined between a second wall and a third wall, the first, second and third walls extend from a base plate and means to cool the base plate.

Preferably the first, second and third walls are cylindrical.

Preferably the second cylindrical wall is arranged within the first cylindrical wall, the third cylindrical wall is arranged within the second cylindrical wall.

Alternatively the first cylindrical wall is arranged within the second cylindrical wall and the third cylindrical wall is arranged within the first cylindrical wall.

Preferably the base plate, the first wall, the second wall and the third wall comprise copper.

Preferably a fourth wall extends from the base plate and is arranged within the third wall, a third chamber is defined between the third wall and the fourth wall, a fourth chamber is defined within the fourth wall, a material having a high specific heat capacity is arranged within the third chamber.

The fourth chamber may be evacuated.

The fourth wall may comprise copper.

The present invention will be more fully described by way of example with reference to the accompanying drawings in which:—

Figure 1:
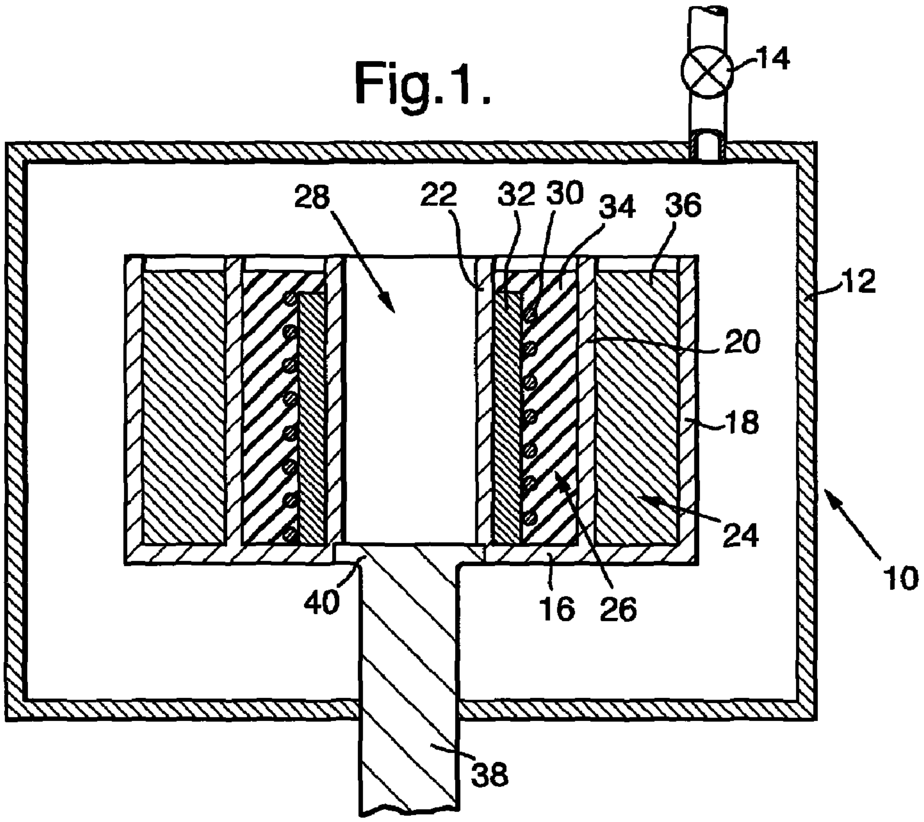
FIG. 1 shows a first embodiment of a superconducting device according to the present invention.

A superconducting device 10 according to the present invention is shown in FIG. 1, and the superconducting device 10 comprises a vacuum chamber 12 and a pump 14 to evacuate the vacuum chamber 12. A base plate 16 is provided within the vacuum chamber 12 and a first cylindrical wall 18, a second cylindrical wall 20 and a third cylindrical wall 22 extend from the base plate 16. The second and third cylindrical walls 20 and 22 are arranged coaxially with the first cylindrical wall 18. A first annular chamber 24 is defined between the first cylindrical wall 18 and the second cylindrical wall 20 and a second annular chamber 26 defined between the second cylindrical wall 20 and the third cylindrical wall 22. A third chamber 28 is defined within the third cylindrical wall 22. A superconducting wire 30 is arranged within the second annular chamber 26. A cryogenic insulating material is arranged within the second annular chamber 26 to encapsulate the superconducting wire 30 and a material 36 having a high specific heat capacity is arranged within the first annular chamber 24 and there are means 38 to cool the base plate 16. The means 38, 40 to cool the base plate 16 comprises a cryocooler 38 and the head 40 of the cryocooler 38 is in direct thermal contact with the base plate 16. The second cylindrical wall 20 is arranged within the first cylindrical wall 18 and the third cylindrical wall 22 is arranged within the second cylindrical wall 20. The superconducting wire 30 is arranged as at least one coil in the second annular chamber 26 and the superconducting wire 30 is arranged on a tubular former 32.

A superconducting element consisting of the tubular former 32 and the superconducting wire 30 wrapped around tubular former 32 are located between the second cylindrical wall 20 and the third cylindrical wall 22. The cryogenic electrically insulating material 34 is inserted, preferably by a vacuum pressure impregnation process, into the second annular chamber 26. The cryogenically electrically insulating material 34 is preferably arranged to have good thermal conductivity. The cryogenic insulating material 34 comprises a cryogenic insulating resin. The resultant structure in the second annular chamber 26 between the second and third cylindrical walls 20 and 22 forms a solid insulation to withstand the required voltage of the device. The second cylindrical wall 20 is preferably thinner than the first and third cylindrical walls 18 and 22 to reduce eddy current losses in the second cylindrical wall 20. The primary function of the second cylindrical wall 20 is to provide an earth conductor and a secondary function is to provide a cooling path. The thickness of the second cylindrical wall 20 is selected dependent upon the cooling effectiveness versus eddy current losses due to the AC field generated by the superconducting wire 30.

The superconducting wire 30 is circular in cross-section, but the superconducting wire may be a tape or may have other suitable shapes. The superconducting wire 30 comprises magnesium diboride.

In this example the superconducting wire 30 forms a superconducting fault current limiter, but may be used for other purposes.

The base plate 16, the first cylindrical wall 18, the second cylindrical wall 20 and the third cylindrical wall 22 comprise a high thermal conductivity metal, e.g. copper.

The first annular chamber 24 between the first cylindrical wall 18 and the second cylindrical wall 20 is filled with a high specific heat capacity material 36. The material 36 having a high specific heat capacity comprises an oil, a grease, water or a wax. The oil may be an electrical oil, for example Midel Oil®, the grease may be a vacuum grease, for example Apiezon N cryogenic high vacuum grease, the wax may be beeswax or paraffin wax. The material 36 is preferably a liquid, or a paste, at room temperature to enable the material 36 to be poured into the first annular chamber 24. The material 36 does not need to provide electrical insulation and therefore it does not matter if the material 36 cracks or out-gasses. A conducting metal mesh, e.g. a copper mesh may be provided in the material 36 to further enhance heat transfer and to prevent any concerns with cracking of the material 36 due to thermal contraction. The material 36 is a non-cryogenic material, which has a boil-off temperature that is higher than room temperature. The material 36 is preferably non-flammable, must have a high specific heat capacity at low temperatures and is preferably environmentally safe. The use of such a material 36 reduces health and safety requirements, reduces the through life costs of the product and will enable the complete manufacture of the device at the manufacturing site, with no filling processes required at the installation site, whilst providing the specific heat capacity to give longer endurance.

The third annular chamber 28 is evacuated, because it is connected to the interior of the vacuum chamber 12.

It may be possible to provide a lid, which is secured and sealed to the first, second and third annular walls to close the first and second annular chambers.

The present invention has the following advantages, the superconducting device is supported directly from below by the cold head of the cryogenic cooler and does not require to be supported from above and does not require a flexible thermal link to allow for contraction. If the material having a high specific heat capacity and the cryogenic insulating material do not off-gas there is no need for a cover to close the first and second annular chambers. No pressure relief valves are required. The requirement to provide electrical insulation is separated from the requirement to provide thermal stability and this increases the flexibility on the volume of high specific heat capacity material.

Figure 2:
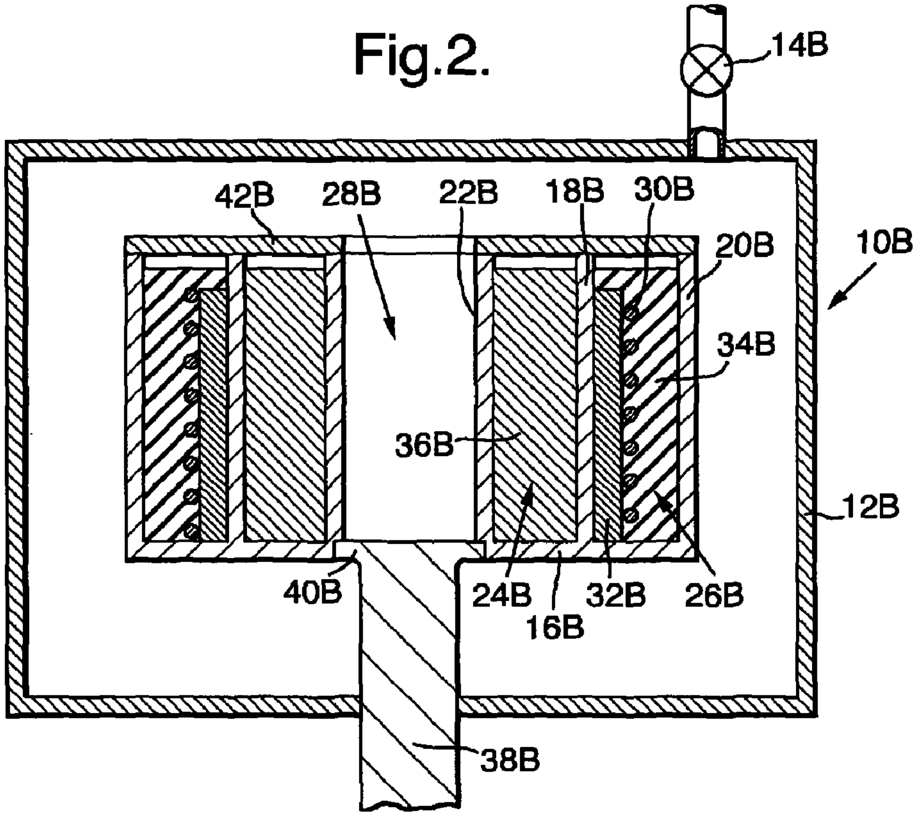
FIG. 2 shows a second embodiment of a superconducting device according to the present invention.

Another superconducting device 10B according to the present invention is shown in FIG. 2, and the superconducting device 10B comprises a vacuum chamber 12B and a pump 14B to evacuate the vacuum chamber 12B. A base plate 16B is provided within the vacuum chamber 12B and a first cylindrical wall 18B, a second cylindrical wall 20B and a third cylindrical wall 22B extend from the base plate 16B. The second and third cylindrical walls 20B and 22B are arranged coaxially with the first cylindrical wall 18B. A first annular chamber 24B is defined between the first cylindrical wall 18B and the third cylindrical wall 22B and a second annular chamber 26B defined between the second cylindrical wall 22B and the first cylindrical wall 18B. A third chamber 28B is defined within the third cylindrical wall 22B. A superconducting wire 30B is arranged within the second annular chamber 26B. A cryogenic insulating material 34B is arranged within the second annular chamber 26B to encapsulate the superconducting wire 30B and a material 36B having a high specific heat capacity is arranged within the first annular chamber 24B and there are means 38B, 40B to cool the base plate 16B. The means 38B, 40B to cool the base plate 16B comprises a cryocooler 38B and a head 40B of the cryocooler 38B is in direct thermal contact with the base plate 16B. The first cylindrical wall 18B is arranged within the second cylindrical wall 20B and the third cylindrical wall 22B is arranged within the first cylindrical wall 18B. The superconducting wire 30B is arranged as at least one coil in the second annular chamber 26B and the superconducting wire 30B is arranged on a tubular former 32B. A lid 42B is provided and the lid 42B is secured to and sealed to the first, second and third cylindrical walls 18B, 20B and 22B to close the first and second annular chambers 24B and 26B.

The embodiment in FIG. 2 is substantially the same as that in FIG. 1 and works in substantially the same way.

Figure 3:
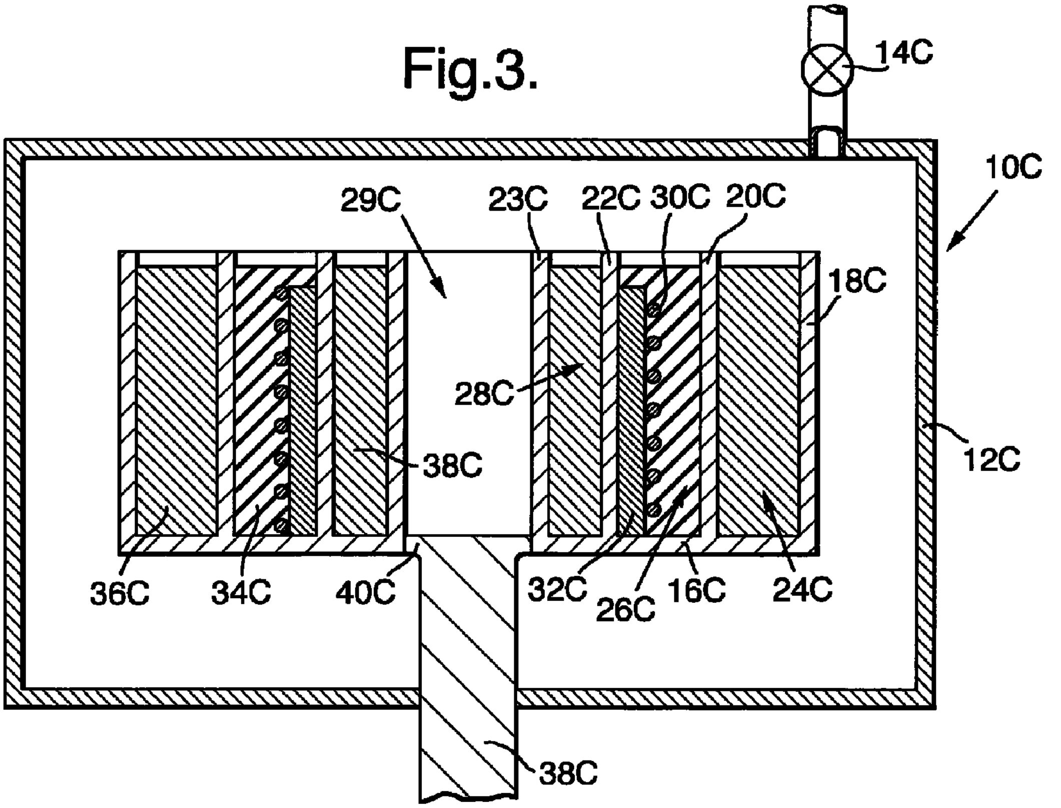
FIG. 3 shows a third embodiment of a superconducting device according to the present invention.

A further superconducting device 100 according to the present invention is shown in FIG. 3, and the superconducting device 10 comprises a vacuum chamber 12C and a pump 14C to evacuate the vacuum chamber 12C. A base plate 16C is provided within the vacuum chamber 12C and a first cylindrical wall 18C, a second cylindrical wall 20C, a third cylindrical wall 22C and a fourth cylindrical wall 23C extend from the base plate 16C. The second, third and fourth cylindrical walls 20C, 22C and 23C are arranged coaxially with the first cylindrical wall 18C. A first annular chamber 24C is defined between the first cylindrical wall 18C and the second cylindrical wall 20C, a second annular chamber 26C is defined between the second cylindrical wall 20C and the third cylindrical wall 22C and a third annular chamber 28C is defined between the third cylindrical wall 22C and the fourth cylindrical wall 23C. A fourth chamber 29C is defined within the fourth cylindrical wall 23C. A superconducting wire 300 is arranged within the second annular chamber 26C. A cryogenic insulating material 34C is arranged within the second annular chamber 26C to encapsulate the superconducting wire 30C and a material 36C having a high specific heat capacity is arranged within the first annular chamber 24C and there are means 38C to cool the base plate 16C. The means 38C, 40C to cool the base plate 16C comprises a cryocooler 38C and the head 40C of the cryocooler 38C is in direct thermal contact with the base plate 16C. The second cylindrical wall 20C is arranged within the first cylindrical wall 18C, the third cylindrical wall 22C is arranged within the second cylindrical wall 20C and the fourth cylindrical wall 23C is arranged within the third cylindrical wall 22C. A material 38C having a high specific heat capacity is arranged within the third annular chamber 28C. The superconducting wire 30C is arranged as at least one coil in the second annular chamber 26C. The superconducting wire 30C is arranged on a tubular former 32C. The fourth chamber 29C may be evacuated. The fourth cylindrical wall 23C comprises a metal, for example copper.

The embodiment in FIG. 3 is substantially the same as that in FIG. 1 and works in substantially the same way.

Figure 4:
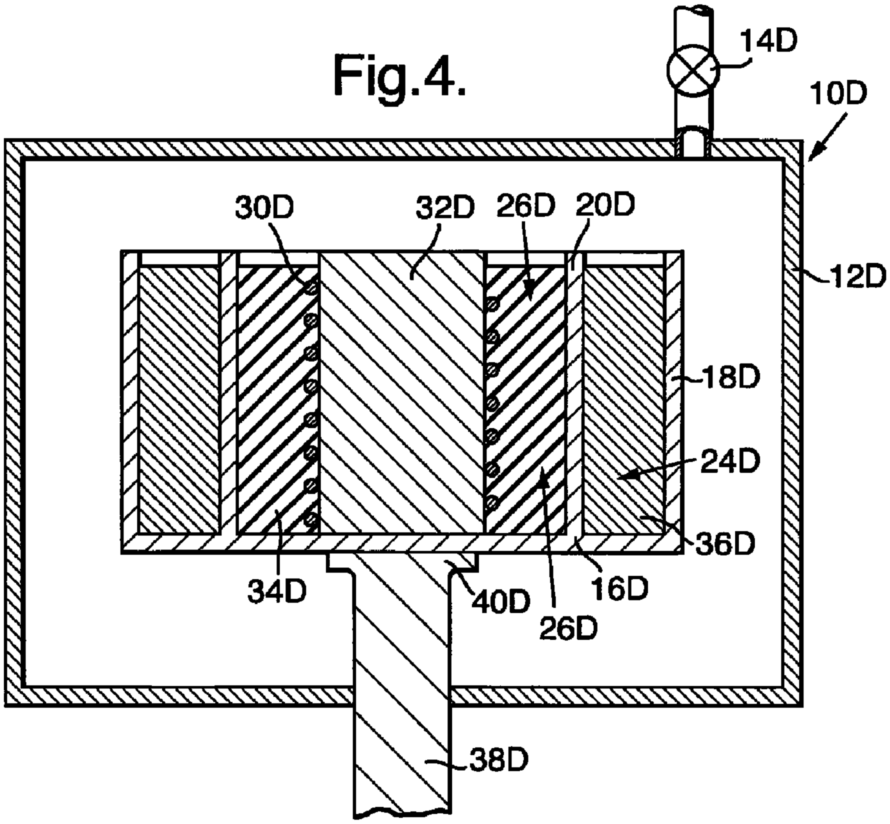
FIG. 4 shows a fourth embodiment of a superconducting device according to the present invention.

Another superconducting device 10D according to the present invention is shown in FIG. 4, and the superconducting device 10D comprises a vacuum chamber 12D and a pump 14D to evacuate the vacuum chamber 12D. A base plate 16D is provided within the vacuum chamber 12D and a first cylindrical wall 18D and a second cylindrical wall 20D extend from the base plate 16D. The second cylindrical wall 20D is arranged coaxially with the first cylindrical wall 18D. A first annular chamber 24D is defined between the first cylindrical wall 18D and the second cylindrical wall 20D. A second annular chamber 26D is defined between the second cylindrical wall 20D and a solid cylindrical former 32D. A superconducting wire 30D is arranged within the second annular chamber 26D. A cryogenic insulating material 34D is arranged within the second annular chamber 26D to encapsulate the superconducting wire 30D and a material 36D having a high specific heat capacity is arranged within the first annular chamber 24D and there are means 38D to cool the base plate 16D. The means 38D, 40D to cool the base plate 16D comprises a cryocooler 38D and the head 40D of the cryocooler 38D is in direct thermal contact with the base plate 16D. The second cylindrical wall 20D is arranged within the first cylindrical wall 18D. The superconducting wire 30D is arranged as at least one coil in the second annular chamber 26D. The superconducting wire 30D is arranged on a tubular former 32D.

The embodiment in FIG. 4 is substantially the same as that in FIG. 1 and works in substantially the same way.

It is to be noted in the embodiments of the present invention that electrical insulation is provided between the superconducting wire, or superconducting coil, and the base plate and the adjacent cylindrical walls and a cryogenic insulation material, epoxy resin, is provided as the electrical insulation in the second annular chamber. A high heat capacity material is provided in one or more adjacent surrounding annular chamber to act as a thermal ballast.

If water is used as a high specific heat capacity material there is need for a lid on the first chamber to prevent water vapour evaporating and leaking from the first chamber. In addition there is a need for an expansion gap within the first chamber to allow for the expansion of the water as it changes from water to ice at cryogenic temperatures.

It may possible to provide a lid on all the chambers, none of the chambers or on one or more of the chambers as required for the particular circumstances.

The superconducting device may be a superconducting magnet, for example for MRI scanning, NMR spectroscopy, for magnetic material separation, crystal pulling, for a particle accelerator or for a detector. The superconducting device may be a superconducting fault current limiter, a superconducting magnet energy storage device, a superconducting transformer or a superconducting electrical generator.

In the descriptions of the embodiments of the present invention it is clear that the first and second chambers are separated by a common wall or the first and second chambers are separated by a common wall and the second and third chambers are separated by a common wall.

Copper has a gravimetric specific heat capacity of about 25 $Jkg^{-1}k^{-1}$, ice has a gravimetric specific heat capacity of about 260 $Jkg^{-1}k^{-1}$, vacuum grease, N grease, has a gravimetric specific heat capacity of about 175 $Jkg^{-1}k^{-1}$, rubber has gravimetric specific heat capacity of about 200 $Jkg^{-1}k^{-1}$ and solid nitrogen has a gravimetric specific heat capacity of about 1200 $Jkg^{-1}k^{-1}$ all at a cryogenic temperature of 30K. Thus rubber may also be used. Thus the high heat capacity material has a gravimetric specific heat capacity about ten times greater, or an order of magnitude greater than copper. The gravimetric specific heat capacity of high specific heat capacity material is at least 150 $Jkg^{-1}k^{-1}$, preferably 200 $Jkg^{-1}k^{-1}$. Solid nitrogen is not preferred as a high specific heat capacity material because it boils off in some circumstances and creates pressure in the vacuum chamber.

The present invention has been described with reference to cylindrical, walls and annular chambers, it may be equally possible to use other shapes of walls and chambers, for example a wall extending around the sides of a square, a wall extending around the sides of a rectangle, a wall extending around the sides of a hexagon, a wall extending around the sides of a pentagon, a wall extending around the sides of an octagon or a wall extending around the sides of any other figure with three or more sides.

The invention claimed is:

1. A superconducting device comprising a vacuum chamber, means to evacuate the vacuum chamber, a first chamber and a second chamber arranged within the vacuum chamber, the first chamber and the second chamber have a common wall, a superconducting wire arranged within the second chamber, a cryogenic insulating material arranged within the second chamber to encapsulate the superconducting wire and a material having a high specific heat capacity arranged within the first chamber and means to cool the first and second chambers.

2. A superconducting device as claimed in claim 1 comprising a third chamber arranged within the vacuum chamber, the third chamber sharing a common wall with the second chamber or the first chamber.

3. A superconducting device as claimed in claim 2 wherein the second chamber is arranged within the first chamber, the third chamber is arranged within the second chamber or the first chamber is arranged within the second chamber and the third chamber is arranged within the first chamber.

4. A superconducting device as claimed in claim 1 wherein the superconducting wire is arranged as at least one coil in the second chamber.

5. A superconducting device as claimed in claim 1 wherein the superconducting wire is arranged on a tubular former.

6. A superconducting device as claimed in claim 1 wherein the superconducting wire comprises magnesium diboride.

7. A superconducting device as claimed in claim 1 wherein the material having a high specific heat capacity comprises an oil, a grease, water or a wax.

8. A superconducting device as claimed in claim 1 wherein a conducting mesh is provided in the material having a high specific heat capacity.

9. A superconducting device as claimed in claim 8 wherein the oil is an electrical oil, the grease is a vacuum grease or the wax is beeswax or paraffin wax.

10. A superconducting device as claimed in claim 1 wherein the cryogenic insulating material comprises a cryogenic insulating resin.

11. A superconducting device as claimed in claim 1 wherein the superconducting wire forms a superconducting fault current limiter.

12. A superconducting device as claimed in claim 2 wherein the third chamber is evacuated.

13. A superconducting device as claimed in claim 12 wherein the conducting mesh comprises copper.

14. A superconducting device as claimed in claim 2 comprising a fourth chamber arranged within the vacuum chamber, the third chamber sharing a common wall with the second chamber, the fourth chamber sharing a common wall with the third chamber, a material having a high specific heat capacity arranged within the third chamber.

15. A superconducting device as claimed in claim 14 wherein the fourth chamber is evacuated.

16. A superconducting device as claimed in claim 1 wherein the first chamber is defined between a first wall and a second wall, the second chamber is defined between a second wall and a third wall, the first, second and third walls extend from a base plate and means to cool the base plate.

17. A superconducting device as claimed in claim 16 wherein the first, second and third walls are cylindrical, the second cylindrical wall is arranged within the first cylindrical wall, the third cylindrical wall is arranged within the second cylindrical wall or the first cylindrical wall is arranged within the second cylindrical wall and the third cylindrical wall is arranged within the first cylindrical wall.

18. A superconducting device as claimed in claim 16 wherein the base plate, the first wall, the second wall and the third wall comprise copper.

19. A superconducting device as claimed in claim 17 wherein a fourth wall extends from the base plate and is arranged within the third wall, a third chamber is defined between the third wall and the fourth wall, a fourth chamber is defined within the fourth wall, a material having a high specific heat capacity is arranged within the third chamber.

20. A superconducting device as claimed in claim 19 wherein the fourth wall comprises copper.

* * * * *